United States Patent
Krahn et al.

(10) Patent No.: US 6,407,903 B1
(45) Date of Patent: Jun. 18, 2002

(54) PDA COUPLER CONTAINING A FLEXIBLE JOINT

(75) Inventors: John Raymond Krahn; Charles Edward Baumgartner, both of Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/451,023

(22) Filed: Nov. 29, 1999

(51) Int. Cl.$^7$ .......................... H01G 4/228; H01G 4/38
(52) U.S. Cl. ..................... 361/301.3; 361/328
(58) Field of Search ................ 361/301.4, 306.1, 361/308.3, 309, 321.2, 328, 329, 821, 541, 522

(56) References Cited

U.S. PATENT DOCUMENTS

| | | | |
|---|---|---|---|
| 1,455,781 A | * 5/1923 | Dubilier | 361/328 |
| 4,307,434 A | * 12/1981 | Holtzman | 361/328 |
| 4,442,473 A | * 4/1984 | Holtzman et al. | 361/275.4 |
| 4,464,702 A | * 8/1984 | Miller et al. | 361/328 |

OTHER PUBLICATIONS

ADWELL1 International Ltd., PDA Products & Services, http://www.adwell.com/ (Sep. 28, 1999).
Power Diagnostix Systems GmbH, Accessories, http://www.pd–systems.com (Sep. 28, 1999).
Iris Power Engineering, Iris Sensors, http://www.irispower.com (Sep. 28, 1999).
"Partial Discharge Coupler" S.N. 08/970,464, filed Nov. 14, 1997.
"Partial Discharge Coupler" S.N. 08/603,300, filed Feb. 20, 1996.

* cited by examiner

Primary Examiner—Anthony Dinkins
(74) Attorney, Agent, or Firm—Robert P. Santandrea; Noreen C. Johnson

(57) ABSTRACT

A partial discharge analysis (PDA) coupling device contains a shell, a potting material in the shell encapsulating at least two capacitors and a conductive, flexible joint connecting the capacitors. The joint may be a hose clamp or a spring which expands during the thermal expansion of the potting material while providing an electrical connection between the capacitors.

13 Claims, 14 Drawing Sheets

PDA COUPLER CONTAINING A FLEXIBLE JOINT

BACKGROUND OF THE INVENTION

This invention relates generally to electrical coupling devices and more particularly, it relates to Partial Discharge Analysis (PDA) coupling devices containing a flexible joint.

A Partial Discharge Analyzer is an electronic instrument that is used for on-line partial discharge measurements on rotating machines, such as motors and generator stator systems. For example, the Partial Discharge Analyzer may be used to monitor the condition of generator stator winding insulation. A Partial Discharge Analyzer uses one or more PDA coupling devices in order to carry out the measurements.

The PDA coupling devices (i.e., PDA couplers) may be installed connected directly on the electrical connection to the machine being monitored. For example, the high voltage side of a PDA coupling device may be connected to the generator stator winding leads and the opposite end of the PDA coupling device may be electrically connected either directly to ground or through an impedance to ground. The PD signals are then detected by various means as they go through the coupler to ground.

One type of prior art PDA coupling device is shown in FIG. 1. The prior art device 1 comprises a cylindrical shell 2 containing a cavity 4. The cavity is filled with an electrical grade potting material 6. The potting material 6 encapsulates a first capacitor 8 and a second capacitor 10. The capacitors 8 and 10 are connected to each other by a first rigid metal rod 11. The first rod 11 screws into the threaded openings in the capacitors 8 and 10. A second rod 12 exits the top of the shell 2 through opening 14 for electrical contact with an external electrical lead, such as a wire (not shown). The shell 2 also contains a second opening 16 in the bottom surface through which a third rod 13 exits.

In general, electrical grade potting and shell materials have larger coefficients of thermal expansion than metals or ceramics. Hence, during thermal cycling of the coupling device, large tensile loads are placed on the ceramic capacitors due to the difference in coefficients of thermal expansion between the rigid metal rod 11 and/or the capacitors 8, 10 and the potting material 6 and/or the shell 2. In other words, the potting material 6 and/or the shell 2 expand at a greater rate than the rigid metal rod 11 and/or the capacitors 8, 10 in response to an increase in temperature. The potting material and/or the shell thus exerts a tensile stress (in the up/down direction in FIG. 1) on the rod 11 and on the ceramic capacitors 8, 10. This is particularly true when one or more terminal leads 12, 13 of a PDA coupling device are fixed by a bolt or other hardware.

Ceramic capacitors do not withstand tensile loads well, and consequently often suffer failure (such as breakage or cracking) upon application of heat to the shell 2 during the operation of the machine being monitored. The PDA coupling device is rendered non-functional upon the failure of the capacitors 8, 10. The present invention is directed to overcoming or at least reducing the problem set forth above.

BRIEF SUMMARY OF THE INVENTION

In accordance with one aspect of the present invention, there is provided a device, comprising a first capacitor, a second capacitor and a flexible connector electrically connecting the first capacitor and the second capacitor.

In accordance with another aspect of the present invention, there is provided a partial discharge analysis coupling device, comprising a shell and a potting material inside the shell encapsulating a first capacitor and a flexible connector electrically connected to the first capacitor.

In accordance with another aspect of the present invention, there is provided a partial discharge analysis coupling device, comprising a shell and a potting material inside the shell encapsulating a first capacitor, a second capacitor and a first means for electrically connecting the first capacitor and the second capacitor and for relieving a tensile load on the first capacitor and the second capacitor during thermal expansion of at least one of the shell and the potting material.

In accordance with another aspect of the present invention, there is provided a device, comprising a shell and a potting material inside the shell encapsulating at least one of a first electrical component, a second electrical component and a flexible connector electrically connecting the first electrical component to the second electrical component.

In accordance with another aspect of the present invention, there is provided a method of making a device, comprising connecting a first electrical component to a second electrical component by a flexible connector and encapsulating at least one of the first electrical component, the second electrical component and the flexible connector with a potting material.

DETAILED DESCRIPTION OF THE INVENTION

Figure 1:
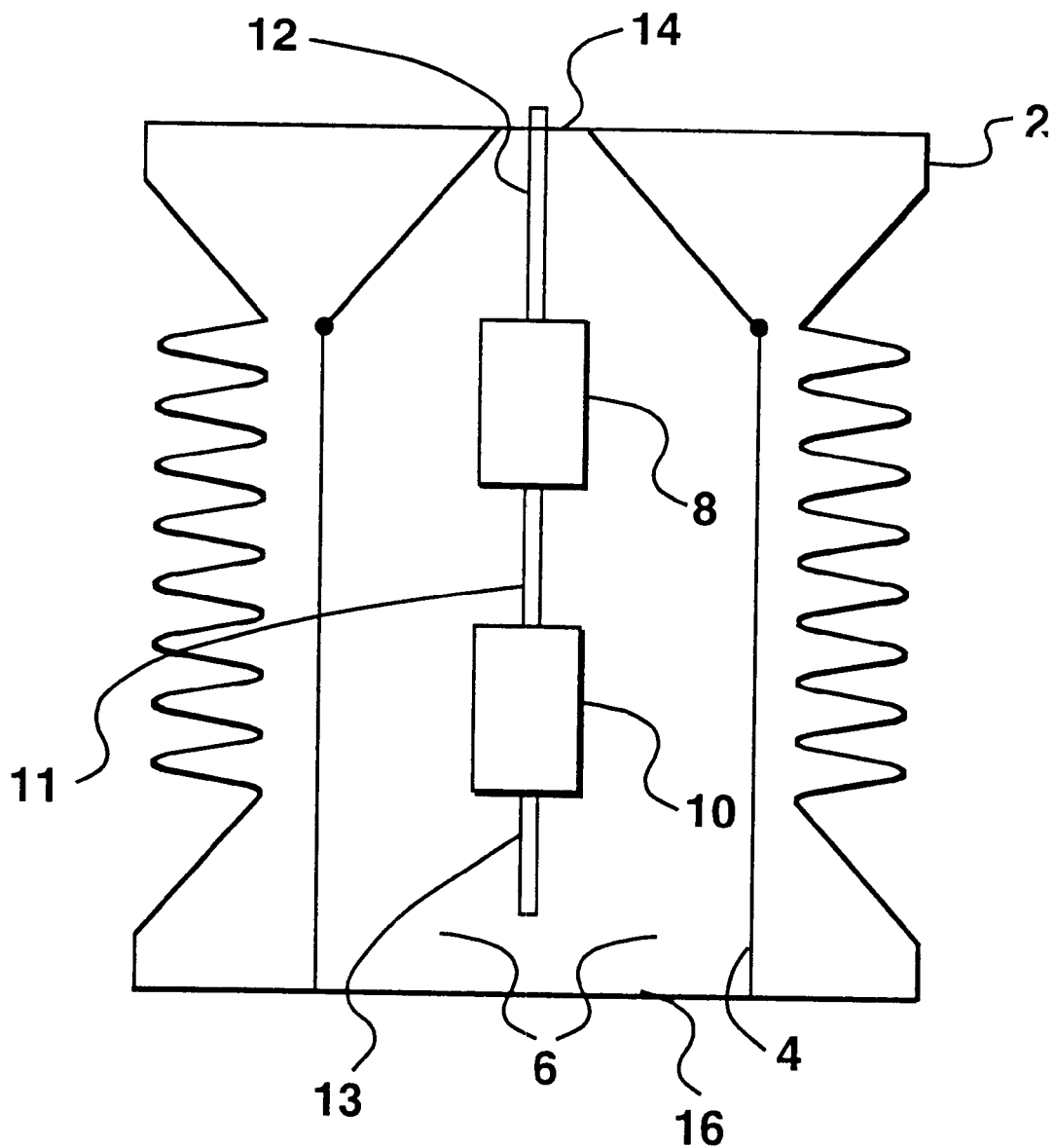
FIG. 1 is a cross-sectional view of a prior art coupling device.

In view of the problems in the prior art, it is desirable to obtain PDA coupling devices that are less prone to thermal cycling tensile stress failure than the prior art devices. It is also desirable to use inexpensive ceramic capacitors in the PDA coupling device to achieve inexpensive monitoring of electrical equipment.

The present inventors have discovered that thermal cycling or stress failure of PDA coupling devices, particularly those employing capacitors, such as ceramic capacitors, may be decreased or even eliminated if at least one capacitor in the coupling device is connected to at least one flexible electrical connector or joint.

Preferably, the flexible electrical connector connects two capacitors located inside the PDA coupling device shell. Most preferably, the connector is axially flexible along the axis between the first capacitor and the second capacitor. Thus, the connector expands in the axial direction along the axis between the first capacitor and the second capacitor when the first capacitor and the second capacitor move away from each other, and contracts in the axial direction when the first capacitor and the second capacitor move toward each other.

Alternatively, in a PDA coupling device containing one or more capacitors, the flexible electrical connector, may connect a capacitor to an outside terminal, such as a nut, washer, rod, conductive plate or a portion of the machine being monitored, such as a high voltage lead. In another alternative aspect of the invention, the flexible electrical connector may connect a capacitor to a high frequency current transformer or a suitable coupling impedance, such as a resistor or an inductor, located inside or outside the shell of the coupling device. Preferably, the connector is axially flexible along the axis between the capacitor and the transformer or the coupling impedance.

In another alternative aspect of the invention, the PDA coupling device contains plural flexible electrical connectors. The plural flexible connectors may connect three or more capacitors to each other. Alternatively, the plural flexible connectors may connect at least one capacitor to at least one of a current transformer, a suitable coupling impedance, a fuse and an outside terminal of the coupling device.

Furthermore, the use of a flexible connector is not limited to a PDA coupling device. The flexible connector may connect plural electronic components, such as capacitors or resistors, in other electronic devices where the electronic components are subject to tensile thermal or mechanical stresses.

The flexible connector may comprise any shape or material as long they impart flexibility to the connector. Preferably, the connector should be sufficiently flexible to be capable of relieving induced stresses on the capacitor surface as the coupling device is thermally cycled. Most preferably, the connector is axially flexible along the axis between the elements of the coupling device that it connects. Preferably, the connector is sufficiently flexible to expand or contract during thermal expansion or contraction, respectively, of the potting material without breaking, disconnecting from the coupling device components or transferring induced tensile stress sufficient to damage the coupling device components.

In a preferred aspect of the present invention, the flexible connector contains a portion with a non-zero radius of curvature or comprises a circle, an oval, a portion of a circle or a portion of an oval. For example, the connector may be shaped like a hose clamp or may have an "O" shape, a "C" or an "S" shape.

In another preferred aspect of the present invention, the flexible connector comprises a first portion inclined at a first, non-zero angle with respect to the axis between components it connects. Preferably, the connector also comprises a second portion inclined at a second angle with respect to the first portion. For example, the connector may be a spring or have a ">" shape or a "Z" shape or have a portion that comprises a spring, a ">" shape or a "Z" shape in addition to one or more straight, "O" or "C" shaped portions.

In a preferred aspect of the present invention, the connector comprises a steel band or a steel spring. The steel band or spring is preferably thin enough to impart flexibility to the connector. However, other materials besides steel, such as aluminum, brass or their alloys, may be used. The connector may alternatively comprise at least one electrically insulting layer supporting at least one conductive layer.

Furthermore, the connector may also comprise an axially flexible conductive material. In this case, the connector may be linear or rod shaped, because its flexibility will be imparted by its high coefficient of thermal expansion. Preferably, the axially flexible conductive material has a similar coefficient of thermal expansion to the potting material or to the shell of the coupling device. This conductive material may comprise a conductive silicone, such as a silicone elastomer containing metal inclusions or particles that render it conductive.

Figure 2:
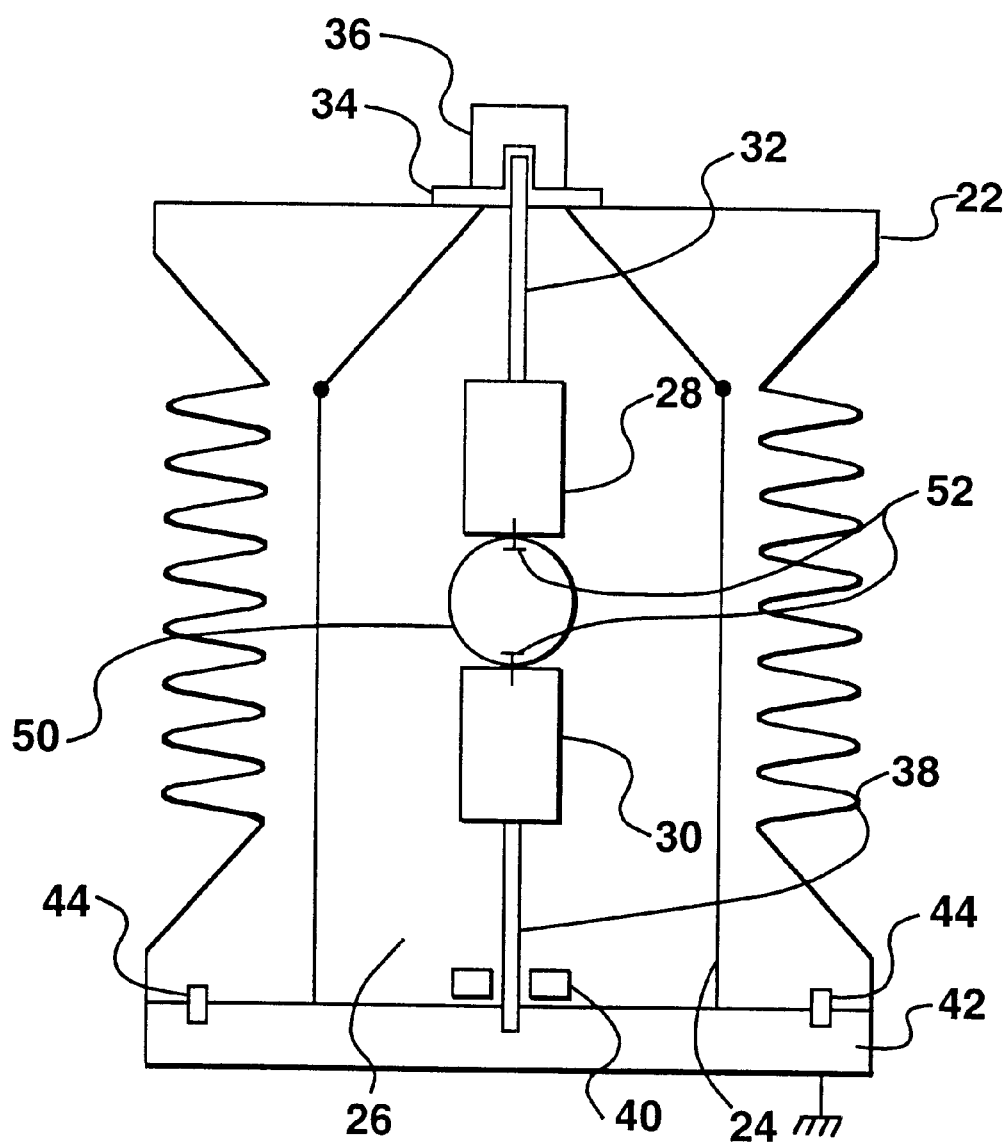
FIGS. 2, 5 and 6 are cross-sectional views of coupling device according to the preferred aspects of the first preferred embodiment of the present invention.

A PDA coupling device according to a first preferred embodiment of the present invention is shown in FIG. 2. The device 20 comprises a shell 22 containing a cavity 24. The shell 22 may comprise any suitable insulating material, such as, for example, aluminum trihydrate, polycarbonate or epoxy, such as glass filled cycloaliphatic epoxy.

The cavity 24 is filled with a potting material 26. The potting material may comprise any suitable encapsulating material, such as, for example, filled or unfilled polyurethane(s), silicone(s), epoxy, a mixture of mica and epoxy, polyester(s), ethylene propylene rubber(s) (EPR), ethylene propylene dimer(s) (EPDM), elastomer(s), fluorocarbon(s) or perfluorocarbon(s). Preferably the potting material is track resistant. For example, the potting material may comprise de-gassed silicone RTV (room temperature vulcanization) supplied by the General Electric Company, Waterford, N.Y. under the product number RTV-6136 A&B or other appropriate types of silicone, including low viscosity silicone fluids, high viscosity silicone polymers, and gelatinous silicone polymers.

The potting material 26 preferably encapsulates a first capacitor 28 and a second capacitor 30. Preferably, the capacitors 28 and 30 are located along the central axis within the shell 22 so as to provide uniform electrical stress. As discussed above, the shell 22 may contain one or more than two capacitors, if desired.

The first capacitor 28 is in contact with a first interconnecting rod or wire 32 which preferably protrudes through an opening in the top surface of the shell 22. The interconnecting rod or wire is preferably secured to the shell 22 with an optional washer 34 and a nut 36. The nut 36 may be used to contact an external lead, such as a wire (not shown), which electrically connects the capacitors 28, 30 with a high voltage source. In an alternative aspect of the invention, the washer 34 and nut 36 may be replaced by a stopper, such as a silicone or a rubber stopper through which the interconnecting rod or wire protrudes. Alternative contact schemes between the first capacitor 28 and the high voltage source are also within the scope of the present invention.

The second capacitor 30 is in contact with a second interconnecting wire or rod 38. A transformer 40 is mounted around the second interconnecting wire or rod 38. The transformer 40 contains separate electrical leads (not shown), as will be described in more detail with reference to FIGS. 14 and 15 below. However, in an alternative aspect of the invention, the transformer may be substituted with a suitable coupling impedance, such as an inductor or a resistor, as will be described in more detail with reference to FIGS. 16 and 17 below. The second interconnecting wire or rod 38 is also preferably in contact with a conductive base 42 which is secured to the shell 22 by screws 44. The base 42 is preferably a metal plate. The base 42 contacts the electrical ground. However, the base 42 may be replaced by an appropriate ground strap or omitted entirely.

The shell 22 is preferably roughly cylindrical in shape and preferably contains ribs 46 on its outer surface and openings in its top and bottom surface that expose the cavity 24. However, the shell 22 may have any other desired shape. The cavity may contain a conical portion near the top surface of the shell 22, as shown in FIG. 2, if desired. However, the cavity 24 may also have any other desired shape sufficient to house the capacitors 28 and 30. For example, the cavity 24 can be entirely cylindrical in shape.

The shell and the cavity may comprise any dimensions required for field usage. For example, the shell 22 may be about 6 inches high and have a diameter of about 5 inches. The cavity may have a diameter of about 2.5 inches.

The first capacitor 28 and the second capacitor 30 are connected by flexible connector 50. The connector 50 is preferably attached to the capacitors by attaching units 52, such as bolts or clamps. Alternatively, the attaching units 52 may comprise integral portions of the connector 50.

Figure 3:
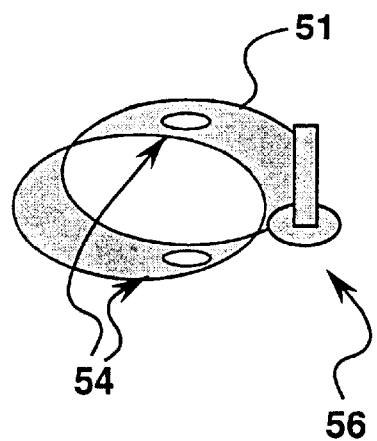
FIGS. 3 and 4 are side three dimensional views of the flexible connector according to the first preferred embodiment of the present invention.
Figure 4:
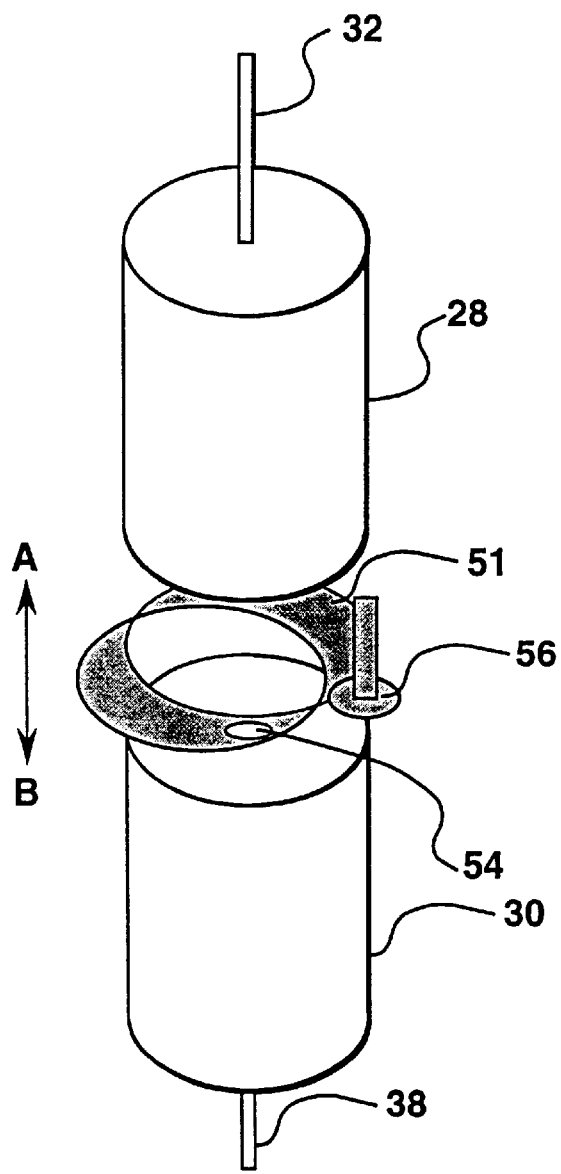

The flexible connector 50 according to the first preferred embodiment of the present invention is shown in detail in FIGS. 3 and 4. As shown in FIG. 3, the flexible connector 50 comprises an oval or circular (i.e., "O" shaped) radiator hose clamp 51 with two holes 54 drilled into it approximately opposite each other or a metal band having a shape of a hose clamp. Bolts 52 (as shown in FIG. 2) are placed through the holes 54 to attach the connector 50 to the capacitors 28, 30 or other components.

The connector 50 preferably also contains an adjusting screw 56. Turning the adjusting screw on the hose clamp 50 allows alignment of the capacitors 28 and 30. However, the screw 56 may be omitted, if desired.

The hose clamp 51 is preferably sufficiently rigid to hold the capacitors 28, 30 in place while the potting material 26 is inserted into the shell cavity 24. However, the band steel of the hose clamp 51 is sufficiently flexible to allow axial flexure of the connection between the two capacitors along line A-B in FIG. 4, while maintaining good electrical contact with the capacitors. This axial flexure minimizes the tensile loads on the capacitors, rendering the coupling device robust to thermal expansion mismatch between electrical components and the shell, the potting material and any other components in the device.

Figure 5:
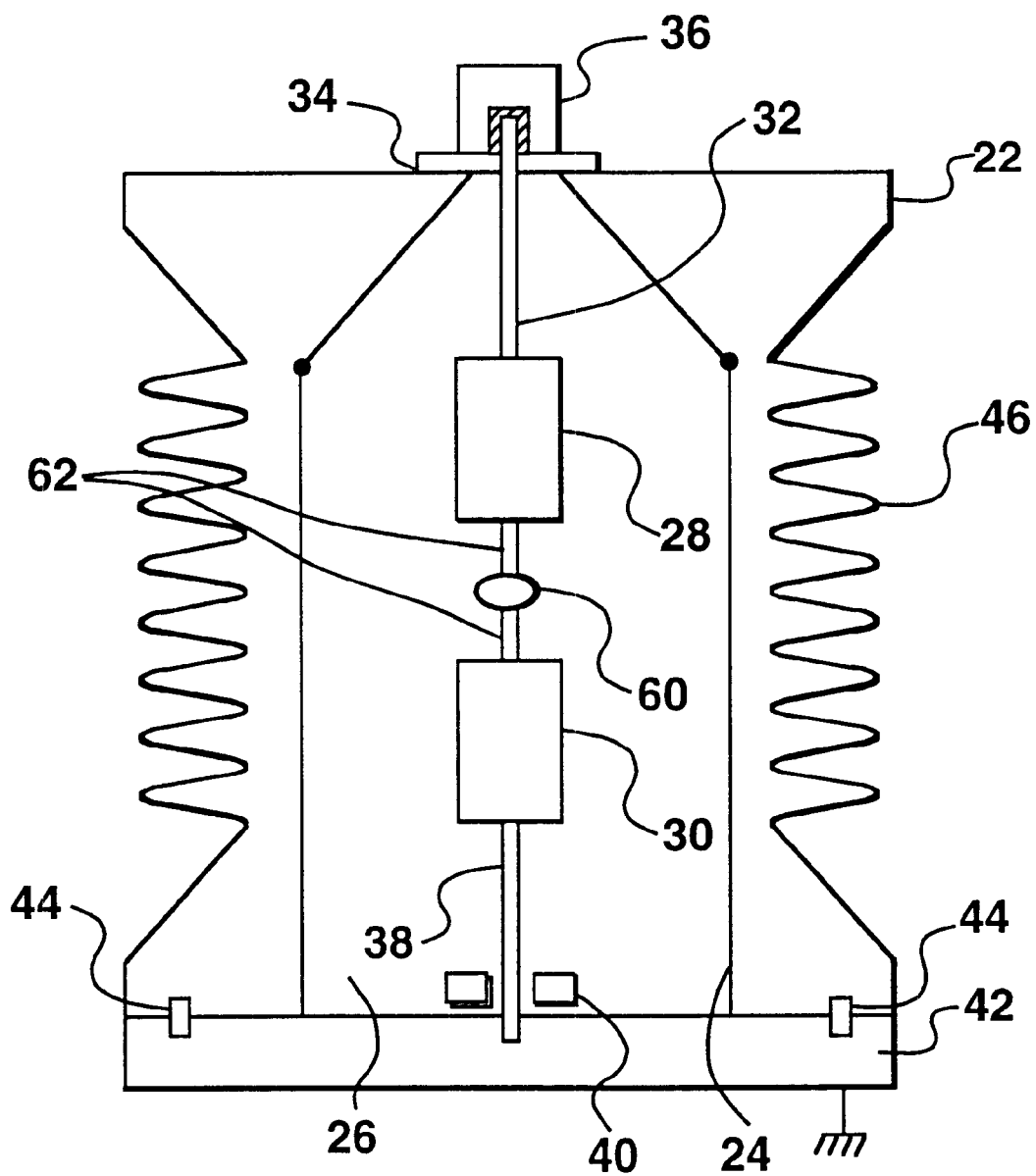
Figure 6:
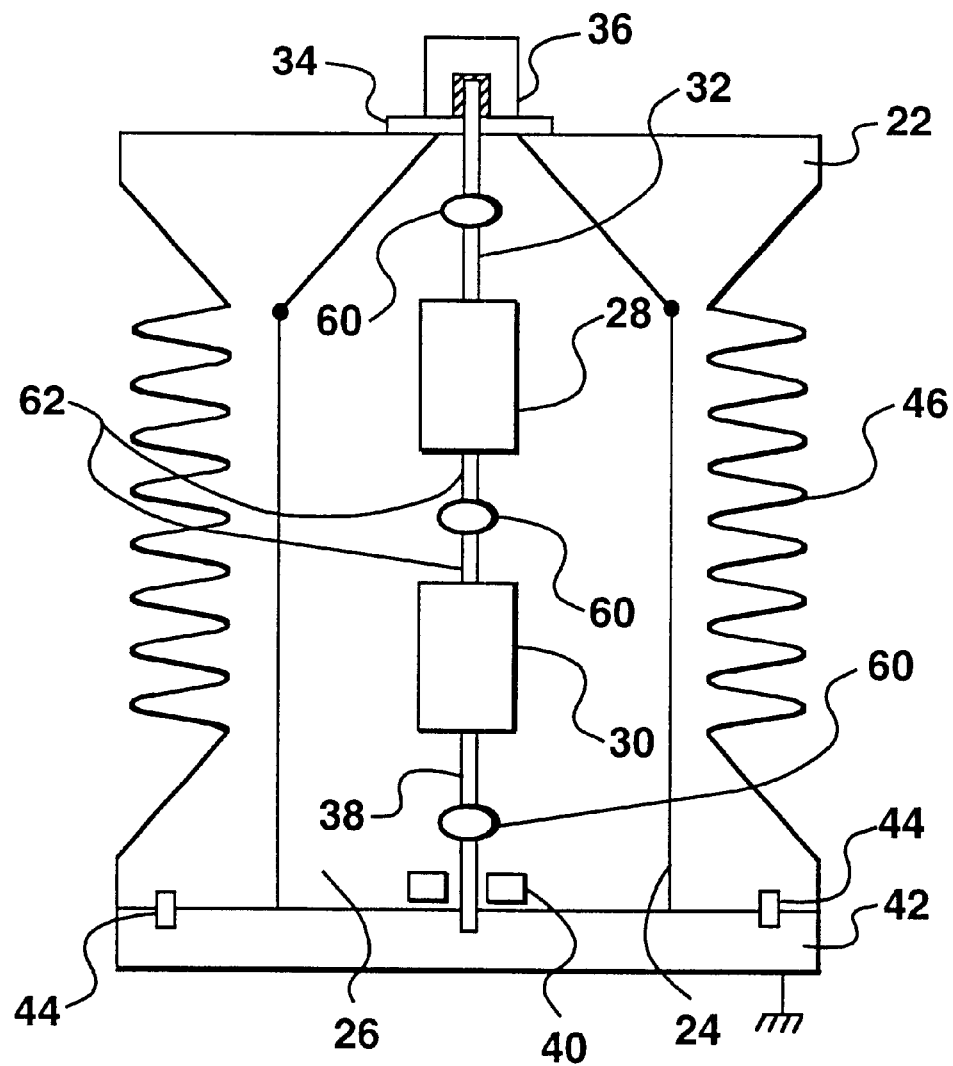

Alternatively, the connector may comprise a flexible oval or circular portion 60 and straight portions 62, as shown in FIG. 5. In another alternative aspect of the first embodiment of the present invention, the flexible connectors 60, having the shape shown in FIGS. 4 or 5, may be located above the first capacitor 28, between the first and second capacitors 28, 30 and/or between the second capacitor 30 and the current transformer 40, as shown in FIG. 6. Furthermore, the second capacitor 30 and/or the current transformer 40 may be omitted, if desired. Thus, the flexible connector(s) 50, 60 of FIGS. 2–6 may be used to connect the first capacitor 28 to an outside lead (i.e., washer 34 and nut 36, etc.), to the ground or possibly through a coupling impedance.

FIGS. 7–13 show several alternative preferred embodiments of the present invention. In these embodiments, all elements and variations of the first preferred embodiment shown in FIGS. 2–6 are the same, except as mentioned otherwise.

Figure 7:
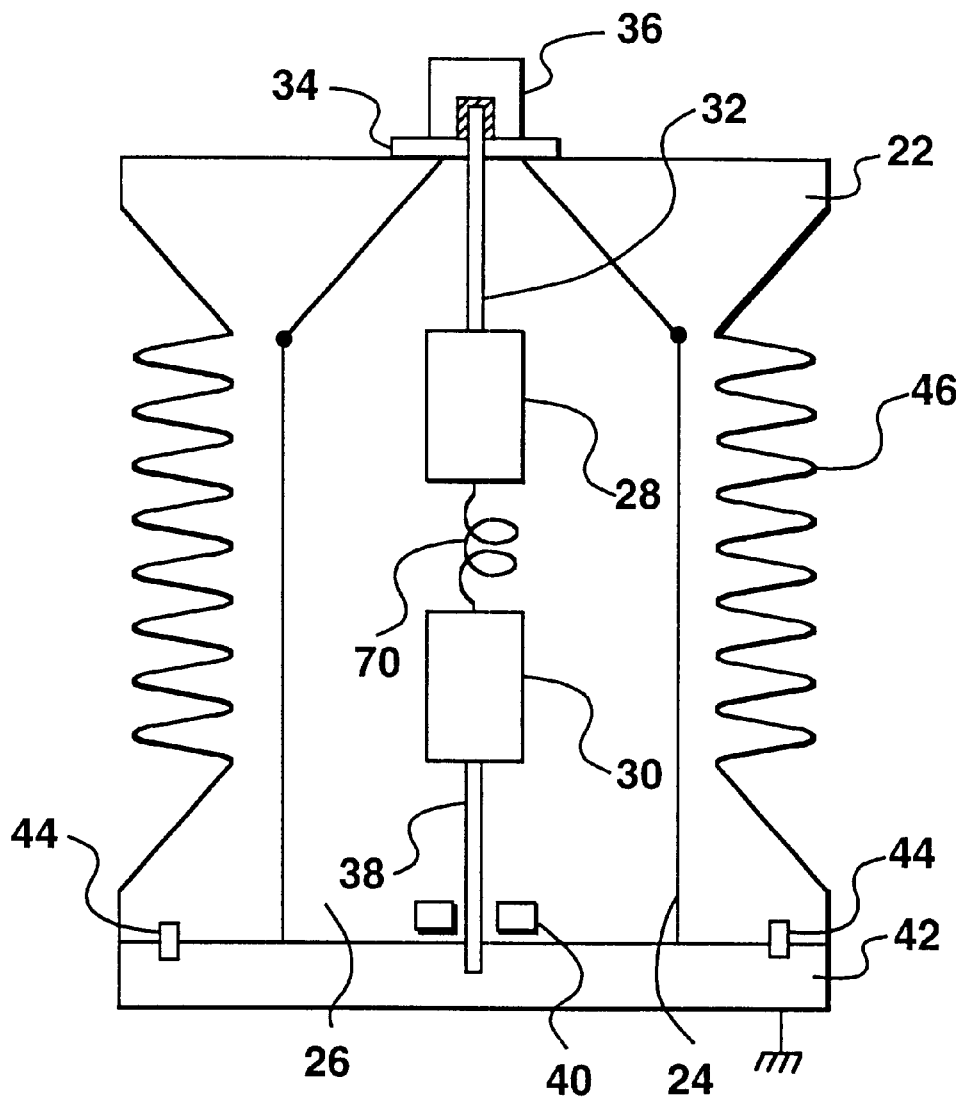
FIGS. 7–13 are cross-sectional views of coupling devices according to the second through eighth preferred embodiments of the present invention.

FIG. 7 shows a second preferred embodiment of the present invention. In this embodiment, the flexible connector comprises a spring 70. The entire connector may comprise a spring 70 or the spring 70 may constitute only a portion of the connector.

Figure 8:
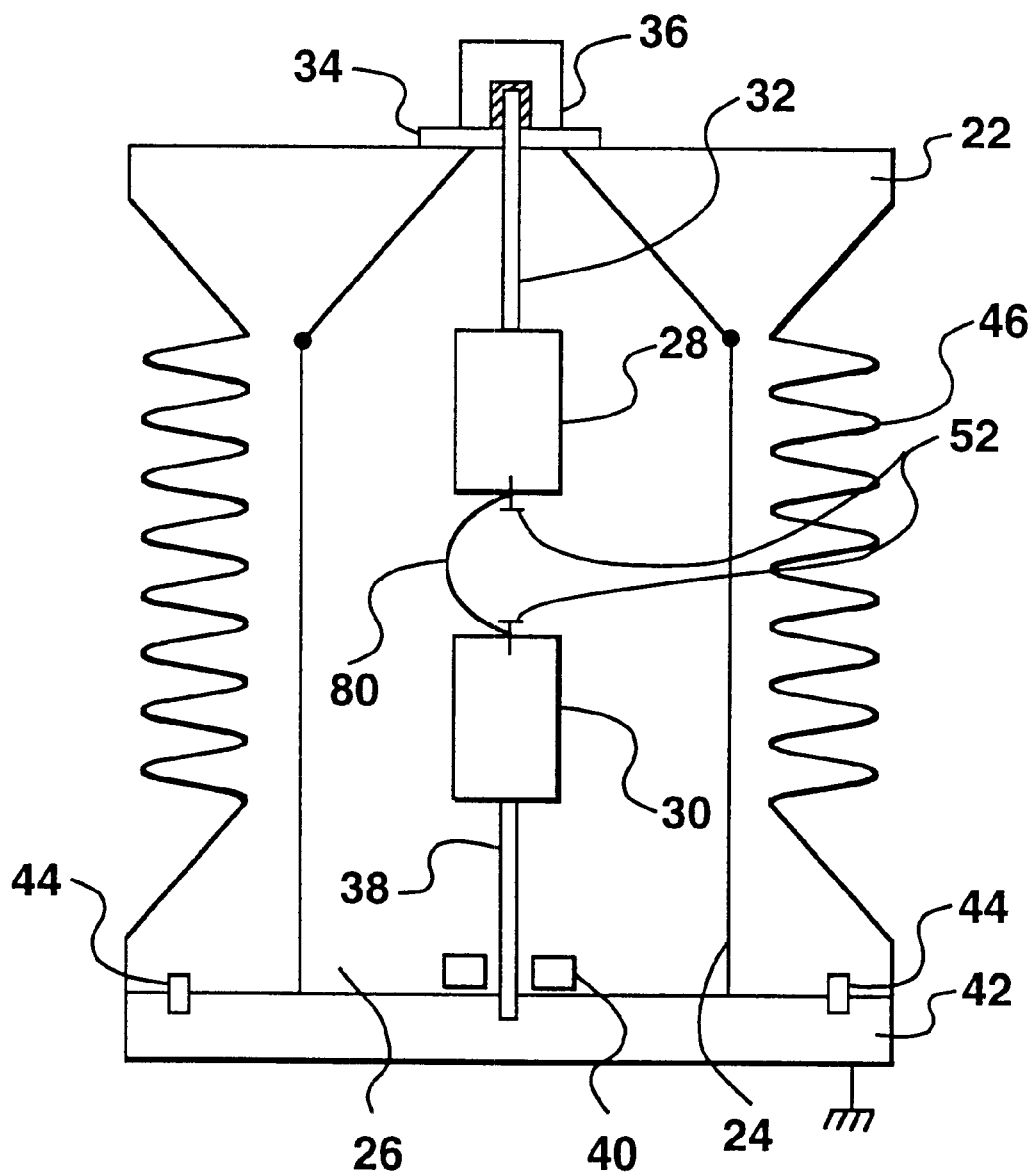
Figure 9:
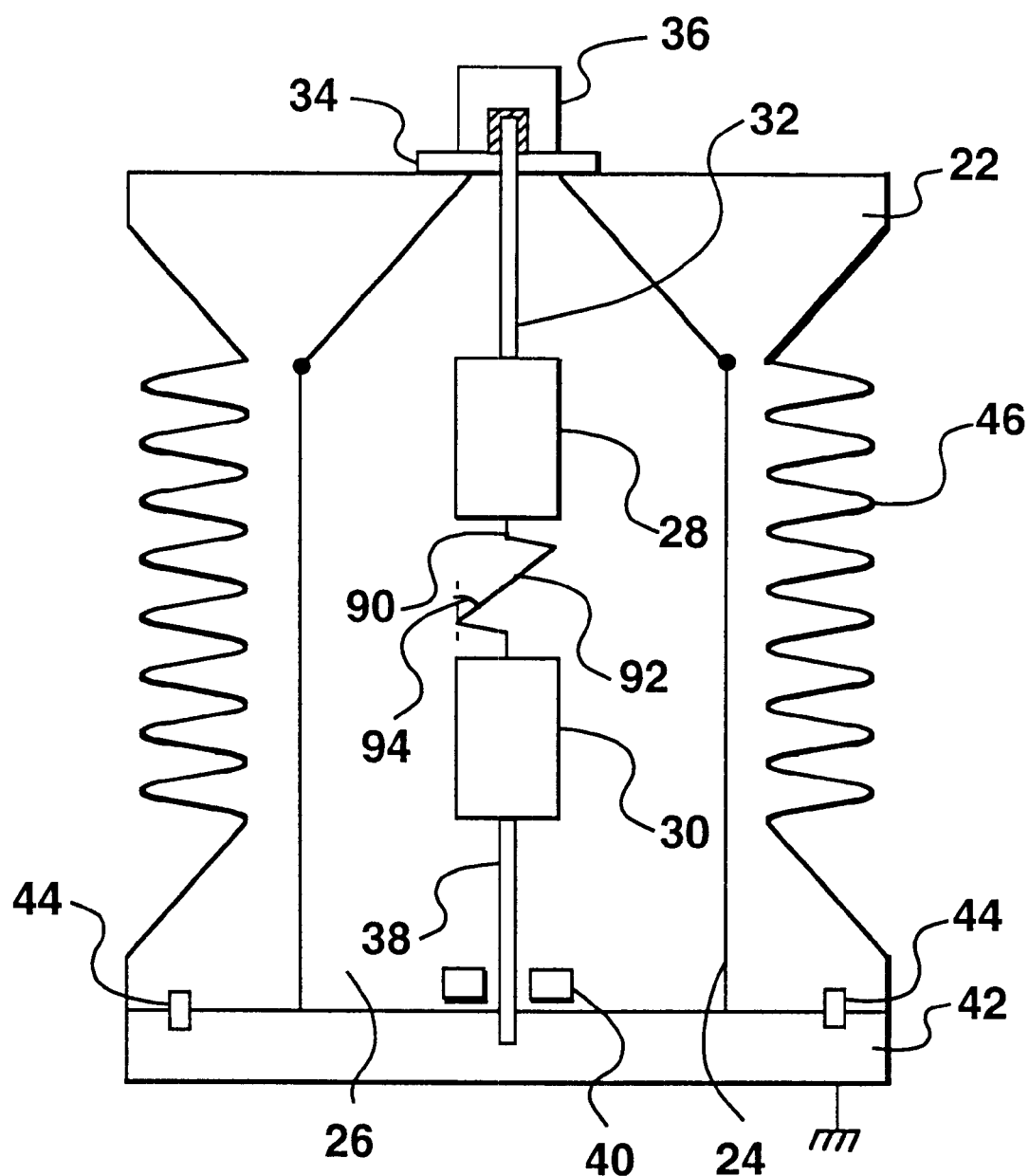
Figure 10:
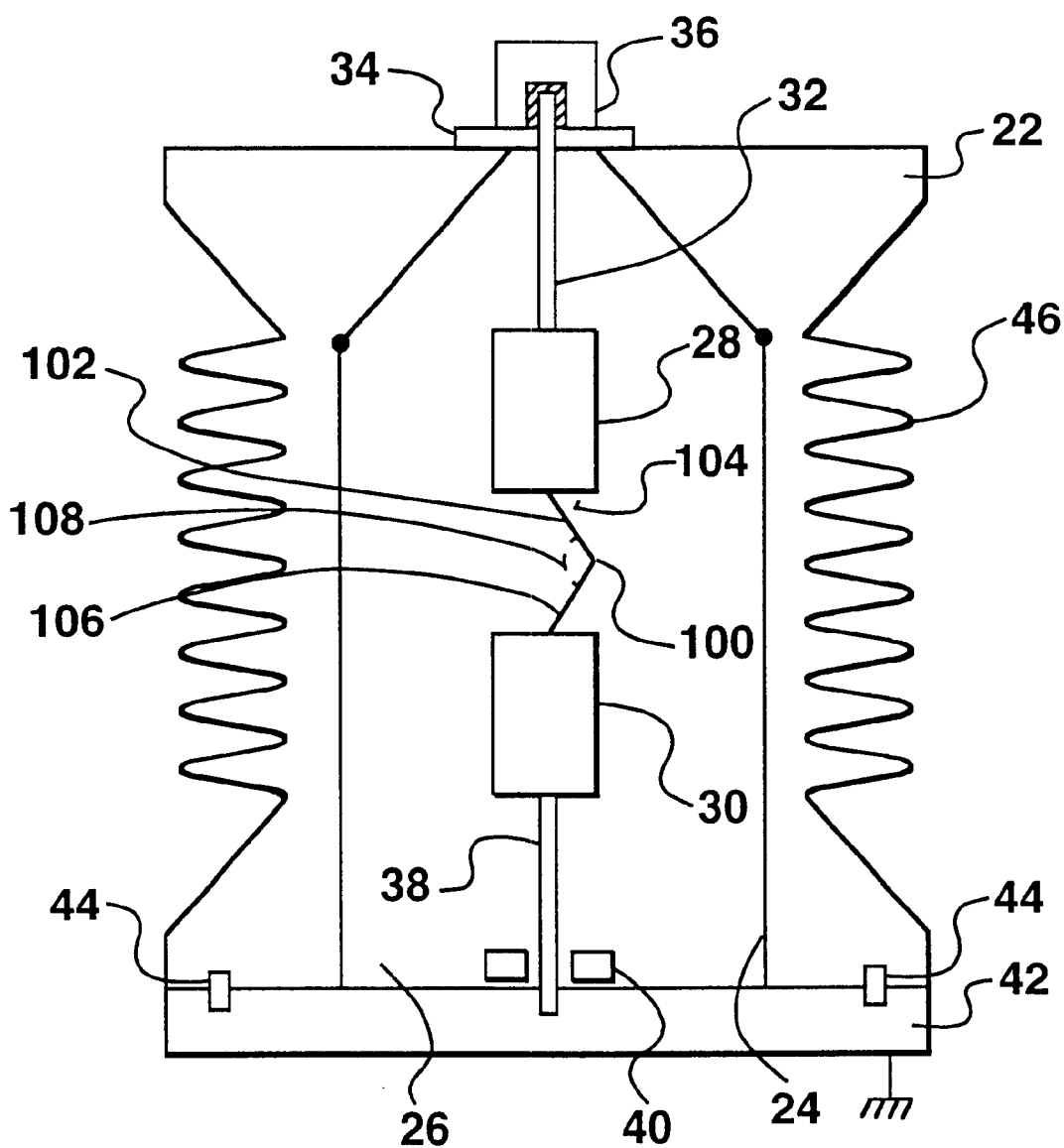

FIGS. 8–10 show the third, fourth and fifth preferred embodiments of the present invention. The flexible connector in the third, fourth and fifth preferred embodiments comprises a "C" shape 80, a "Z" shape 90 and a ">" shape 100, respectively. The flexible connector 80 may also be modified to comprise an "S" shape (i.e., two "C" shapes stacked over each other upside down). The "Z" shape 90 and the ">" shape 100 contain first portions 92, 102, respectively, that are inclined at a first, non-zero angle, 94, 104, respectively, with respect to the axis between the first capacitor 28 and the second capacitor 30. The ">" shape also contains a second portion 106 inclined at a second angle 108 with respect to the first portion 102. Optionally, a hinge may connect the first and second portions of the connector 90, 100.

Figure 11:
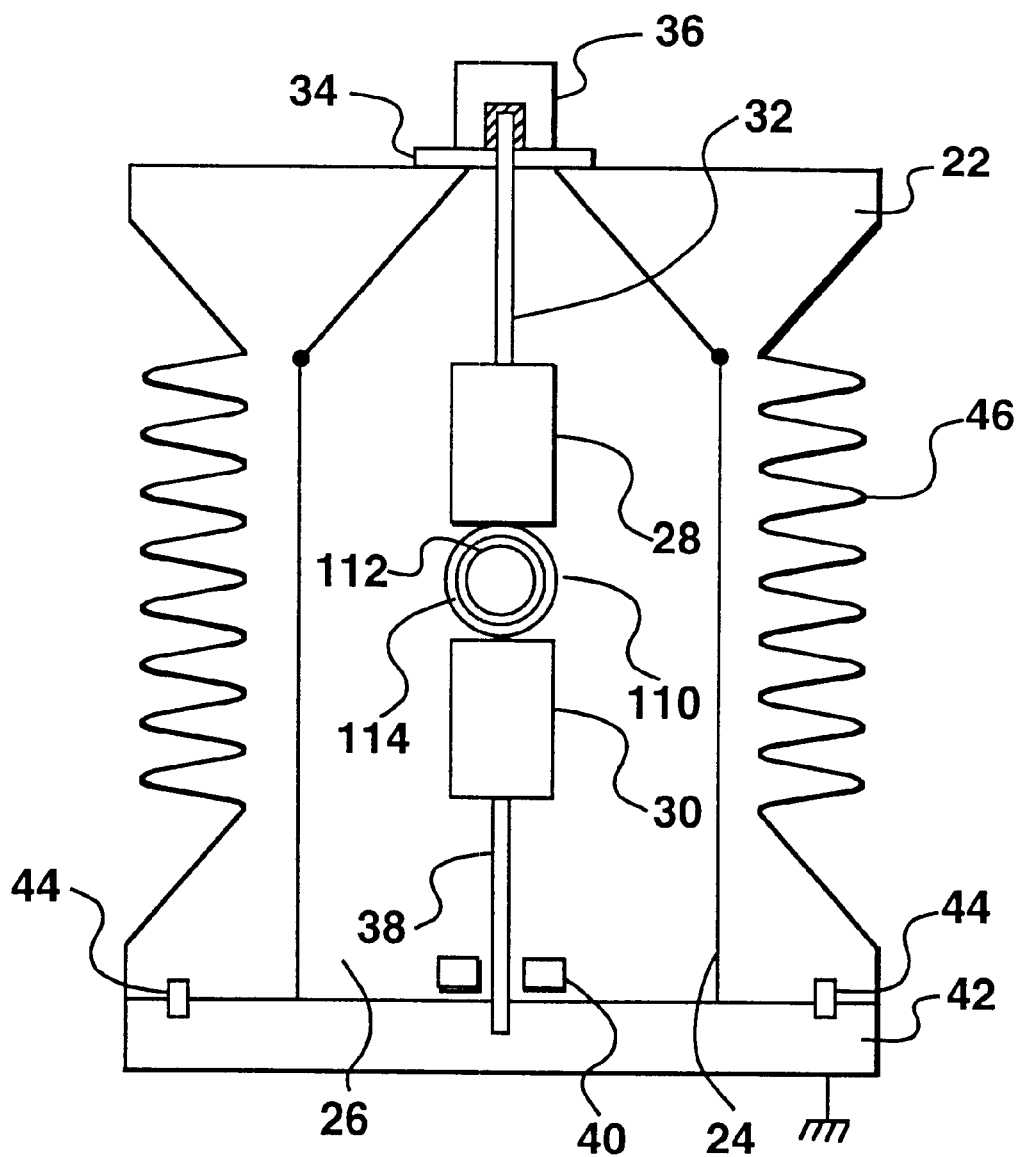

FIG. 11 shows a sixth preferred embodiment of the present invention. In this embodiment, the flexible connector 110 comprises at least one electrically insulating layer 112 supporting at least one conductive layer 114. Preferably, the insulating layer 112 has a similar thermal coefficient of expansion as the potting material 26 and/or the shell 22. The conductive layer 114 is preferably a thin metal strip or wire that electrically connects the capacitors 28 and 30, and is supported by the thicker insulating support layer 112. The conductive layer 114 may be formed on either or both surfaces of the insulating layer 112 or it may be encased between two insulating layers 112. The flexible connector 110 shown in FIG. 11 has an oval shape, but it may have any other shape described above.

Figure 12:
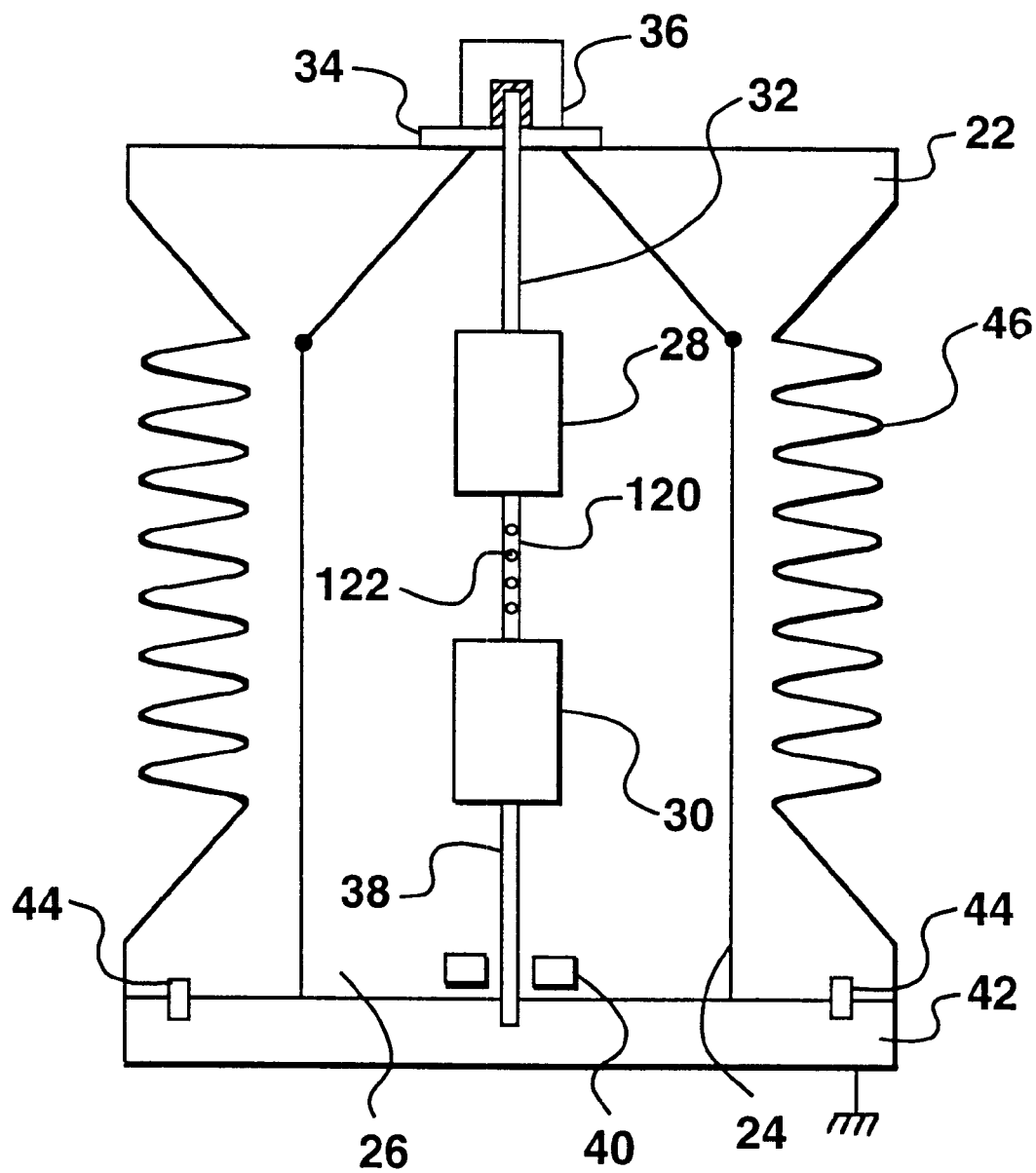

FIG. 12 shows a seventh preferred embodiment of the present invention. The flexible connector comprises a conductive, axially flexible material 120. In this case, the connector 120 may be linear or rod shaped, because its flexibility will be imparted by its high coefficient of thermal expansion. Preferably, the material 120 has a similar coefficient of thermal expansion to the potting material 26 or to the shell 22 of the coupling device. However, the material 120 need not have a similar coefficient of thermal expansion.

For example, if the potting material 26 comprises an insulating polymer (e.g. silicone), then the connector may comprise a conductive polymer, e.g. a silicone such as a polydimethylsiloxane elastomer containing metal particles 122 such as silver or silver coated copper that render it conductive. However, other conductive, flexible polymer (i.e., elastomer, plastic or resin) materials, such as conductive urethanes or conductive, flexible inorganic materials may be used instead of the conductive silicone.

Figure 13:
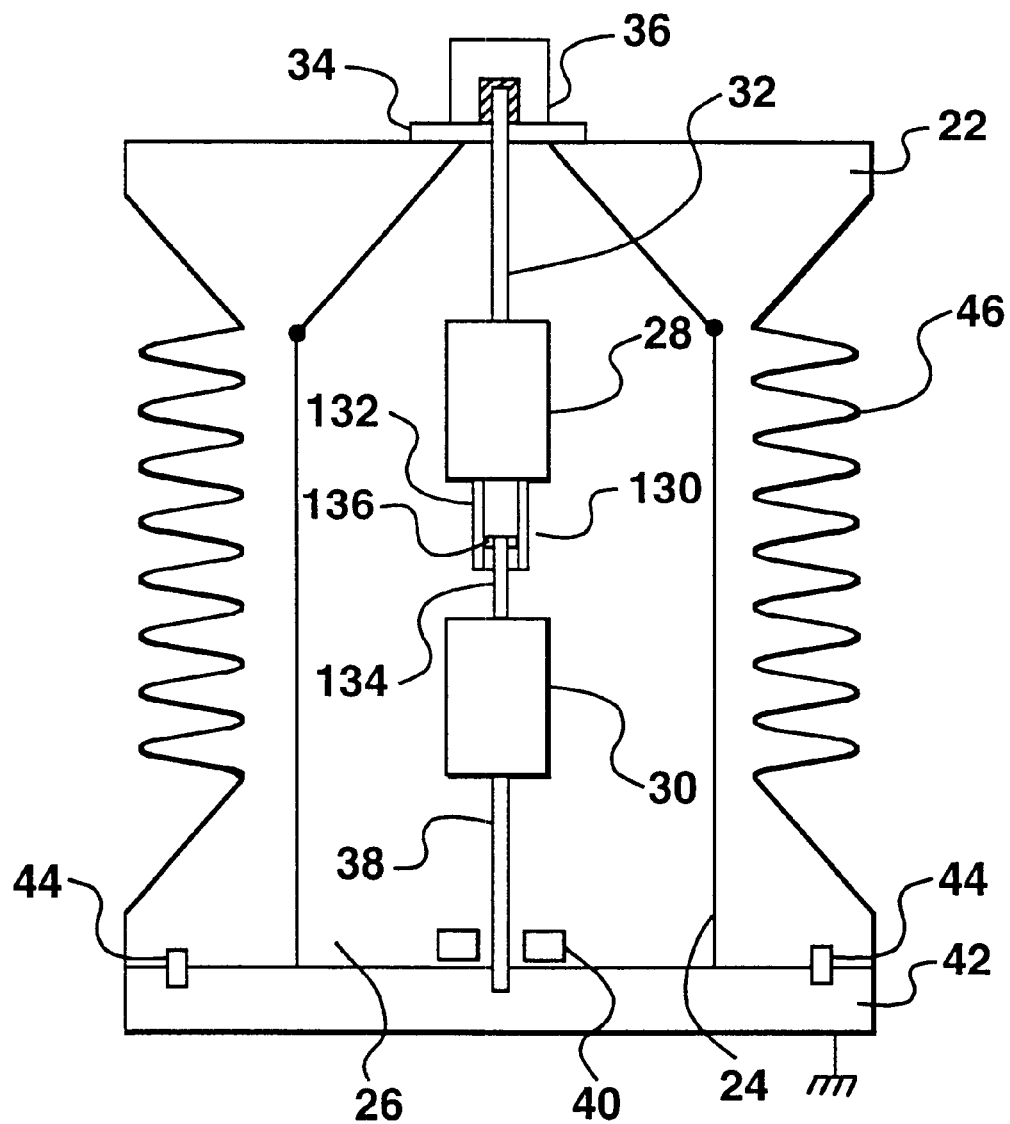

FIG. 13 shows an eighth preferred embodiment of the present invention. The flexible connector 130 comprises a first portion 132 slidably mounted with respect to a second portion 134. For example, the first portion 132 may comprise a hollow rod with a cavity, while the second portion 134 comprises a rod whose diameter is slightly less than the diameter of the cavity in the first rod (i.e., the first and second portions comprise concentric shapes, such as concentric cylinders). This allows the second rod to move axially within the first rod, while still maintaining electrical contact with the first rod. The friction between the outer wall of the second rod and the inner wall of the first rod should be such so as to sufficiently restrict the axial movement of the rods to allow the shell to be properly filled with the potting material, while allowing sufficient axial movement during the thermal expansion of the potting material, and maintain electrical contact.

If desired, the connector 130 may contain one or more optional bearings or gears 136 between the first and second portions 132, 134 to facilitate relative axial movement between the portions 132, 134. Alternatively, if the first and second portions 132, 134 are slidably mounted on the bearings or gears 136, then they may be located side by side, instead of concentrically (i.e., one inside the other).

In the second through eighth embodiments the connector may comprise flexible and rigid portions, as shown in FIG. 5. In another alternative aspect of these embodiments, the flexible connectors may be located above the first capacitor 28, between the first and second capacitors 28, 30 and/or between the second capacitor 30 and the current transformer 40, as shown in FIG. 6. Furthermore, the second capacitor 30 and/or the current transformer 40 may be omitted, if desired. Thus, the flexible connector(s) would be used to connect the first capacitor 28 to an outside lead (i.e., washer 34 and nut 36, etc.), to the ground or possibly through a coupling impedance.

Figure 14:
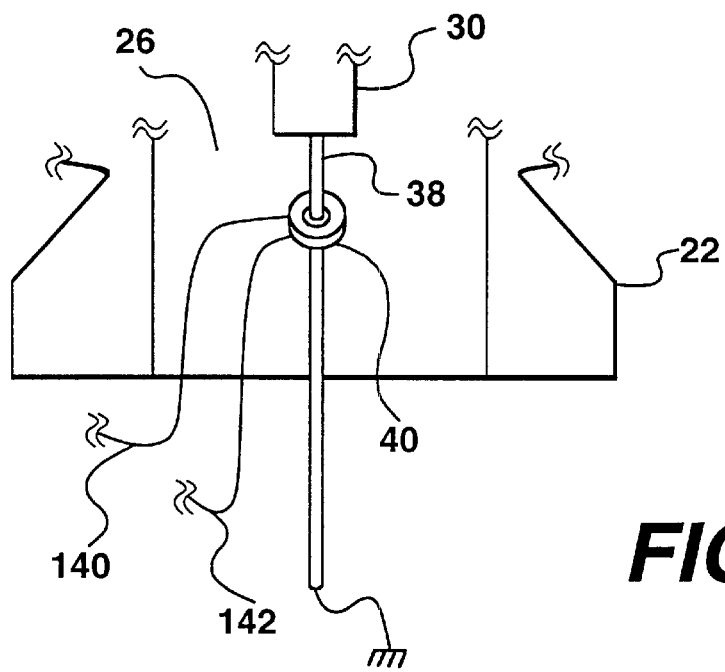
FIGS. 14 and 15 are side three dimensional views of a current transformer according to the preferred aspects of the present invention.

FIGS. 14–17 illustrate in greater detail the lower portion of the PDA coupling device shown in FIGS. 2–13. FIG. 14 illustrates a three dimensional view of the current transformer 40 located inside the potting material 26. Preferably, the current transformer has a doughnut shape and is slidably mounted around the second wire or rod 38. The current transformer 40 contains at least two leads 140, 142 leading out to the Partial Discharge Analyzer (not shown). If the base 42 shown in FIGS. 2 and 5–13 is present, then the leads 140, 142 may pass through openings in the base 42. If the base 42 is not present, then the second wire or rod 38 may be connected to electrical ground, as shown in FIG. 14.

Figure 15:
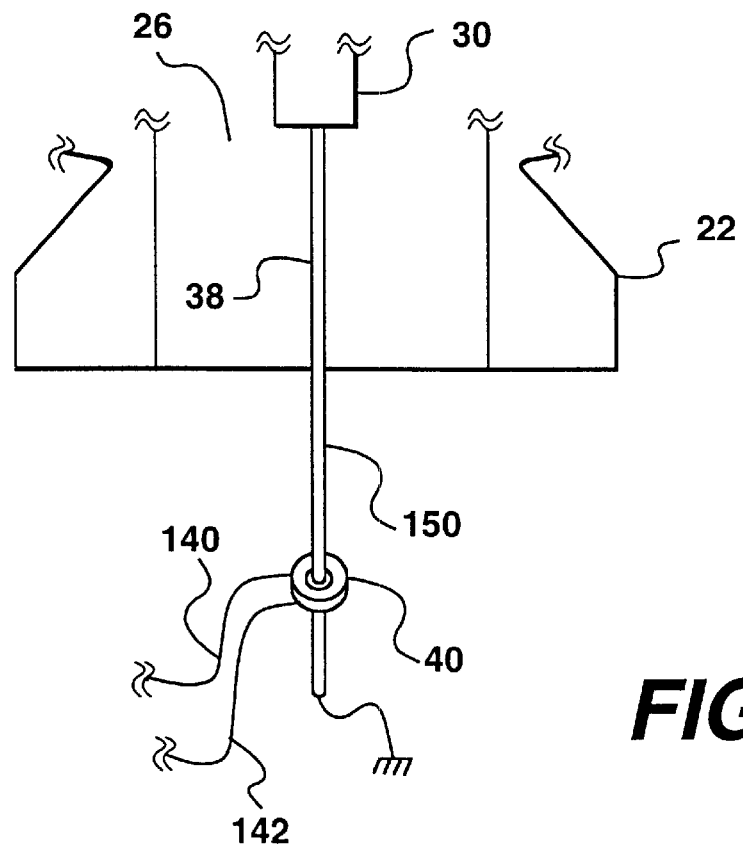

FIG. 15 illustrates an alternative aspect of the present invention, where the current transformer 40 is located outside the shell 22 and the potting material 26. In this aspect of the present invention, the current transformer is located around a ground strap 150. The ground strap 150 may comprise a portion of the second wire or rod 38 extending outside the shell 22 or through the base 42, if the base is present, to the electrical ground. Alternatively, the ground strap 150 may comprise a separate wire that connects the second wire or rod 38 or the base 42 to electrical ground.

Figure 16:
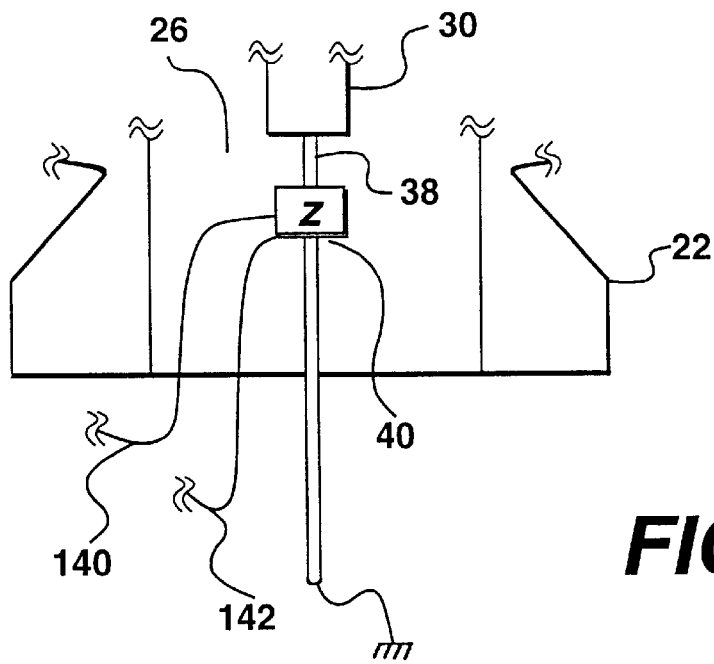
FIGS. 16 and 17 are cross-sectional views of locations for a coupling impedance according to the preferred aspects of the present invention.

FIG. 16 illustrates another alternative aspect of the present invention, where the current transformer 40 is replaced by a suitable coupling impedance 160, such as a resistor or an inductor. In this aspect of the invention, the two leads 162 and 164 are connected to the second wire or rod 38 on either side of the impedance 160. The leads connect the second wire or rod 38 to the Partial Discharge Analyzer (not shown).

Figure 17:
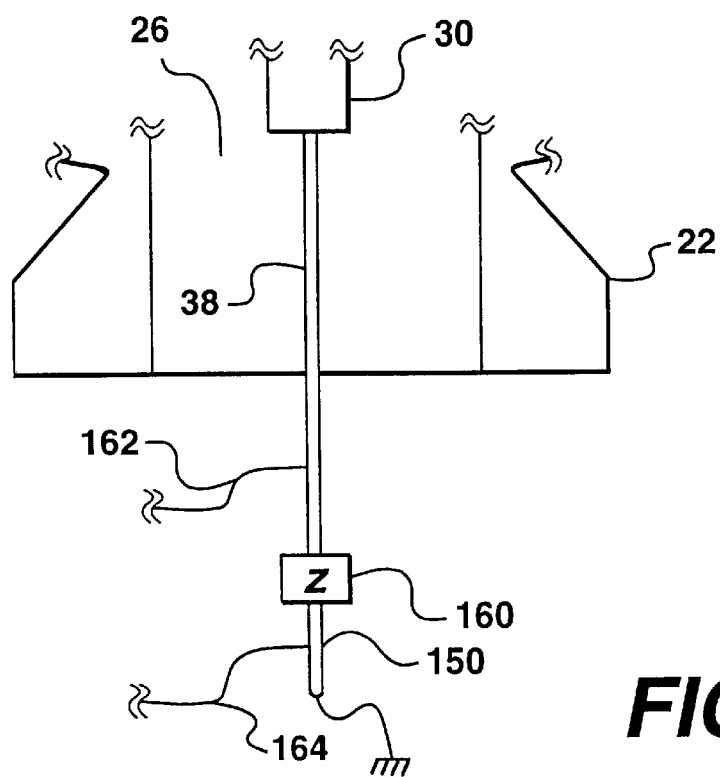

FIG. 17 illustrates another alternative aspect of the present invention, where the coupling impedance 160 is located in series with the ground strap 150. The ground strap 150 may comprise a portion of the second wire or rod 38 extending outside the shell 22 or through the base 42, if the base is present, to the electrical ground. Alternatively, the ground strap 150 may comprise a separate wire that connects the second wire or rod 38 or the base 42 to electrical ground. The two leads 162 and 164 are connected to ground strap 150 on either side of the impedance 160. The leads connect the ground strap to the Partial Discharge Analyzer (not shown).

The PDA coupling device may also contain other optional features described in U.S. patent application Ser. No 08/970,464, filed Nov. 14, 1997, which is a continuation-in-part of U.S. patent application Ser. No. 08/603,300, filed Feb. 20, 1996, now abandoned, both incorporated herein in their entirety by reference. For example, the PDA coupling device may contain a fuse connected in series with the capacitors 28, 30 for protecting the electrical machinery being monitored. A bonding agent, such as an acrylic, can be applied to the shell 22 and/or the capacitors 28, 30 prior to the application of the potting material 26 to improve the adhesion of the potting material 26. Furthermore, the portion of the potting material 26 surrounding the capacitors 28, 30 may be an elastomeric material, while the remainder of the potting material may be a thermoset material, for maintaining rigidity. However, the elastomeric material may be omitted, if desired. The thermoset material eliminates the necessity for shell 22 to be present as part of the PDA coupling device. Thus, the shell 22 and the potting material 26 may comprise single body of the same material, such as the thermoset material.

The PDA coupling device may be manufactured by various different methods. One preferred method of the present invention comprises connecting the electrical components of the coupling device, such as the capacitors 28, 30, the current transformer 40 and/or the impedance 160 to each other with the flexible connector 50, 60, 70, 80, 90, 100, 110, 120, or 130. The connected electrical components are inserted inside the shell 22 and the potting material 26 is then supplied (i.e., injected or poured) into the shell 22 to encapsulate the electrical components. The shell 22 and the potting material 26 may comprise the same material, such as epoxy, or different materials. The different materials may comprise aluminum trihydrate, polycarbonate, glass filled epoxy, a thermoset epoxy or a thermoset polyester for the shell 22 and polyurethane, silicone, epoxy, a combination of mica and epoxy, polyester, ethylene propylene rubber (EPR), ethylene propylene dimer (EPDM), elastomer, fluorocarbon or perfluorocarbon for the potting material 26.

In an alternative preferred method of the present invention, the electrical components connected to each other by the flexible connector are placed into a mold. The potting material 26 is then injected into the mold to encapsulate the electrical components. In one preferred aspect of the present invention, the potted electrical components are inserted into the shell 22. In another preferred aspect of the present invention, the injected material 26 comprises a thermoset material, such as epoxy or polyester, which acts as both the potting material 26 and the shell 22.

In yet another alternative preferred method of the present invention, the electrical components are first encapsulated by an elastomeric material, such as polyurethane, silicone, ethylene propylene rubber (EPRs), ethylene propylene dimer (EPDMs), elastomer, fluorocarbon or perfluorocarbon. The encapsulated electrical components are then further encapsulated by the thermoset material. The elastomeric material acts as a stress relief coating to accommodate the thermal expansion mismatch between the thermoset material and the electrical components. The elastomeric material may be supplied by any method, such as by pouring or injecting the material into a shell containing the electrical components or by injecting it into a mold containing the electrical components. Likewise, the thermoset material may be supplied by any method, such as by pouring or injecting the material into a shell containing the encapsulated electrical components or by injecting it into a mold containing the encapsulated electrical components. The injection molded thermoset material may act as both the shell 22 and the potting material 26 of the PDA coupling device or as a potting material 26 to be inserted into a separate shell 22.

The potting material 26 may be supplied to encapsulate all the electrical components and the flexible connector and/or to fill the entire shell cavity 24. However, if desired, the potting material may be supplied to encapsulate only some of the electrical components and/or the flexible connector and/or to fill only a portion of the cavity 24. Furthermore, the device of the present invention could be made by other methods than those described above and the device should not be deemed limited by the methods described above.

The following examples are merely illustrative, and should not be construed to be any sort of limitation on the scope of the claimed invention.

EXAMPLE 1A

Two ceramic capacitors connected by a flexible connector were mounted inside an insulating shell. The flexible connector was a modified hose clamp containing two holes. The connector was mounted to the capacitor by screws, as shown in FIGS. 2–4. The first capacitor was attached to an interconnecting rod. The top of the rod where it exits the shell was secured to the shell with a steel washer and a nut in an manner as would be used in field installation. The shell was assembled to a metal base plate as shown in FIG. 2. The shell was not filled with a potting material.

The shell was thermally cycled for 12 cycles between room temperature and 125° C. Following the last thermal cycle, the washer was removed and both capacitors were found to be in excellent condition. The lack of capacitor fracture was confirmed by a capacitance measurement.

Comparative Example 1B

An identical assembly was prepared as in example 1A above, except that the two ceramic capacitors were connected by a rigid threaded rod connector. This shell was thermally cycled between room temperature and 125° C. for two cycles. Following the second thermal cycle, the washer was removed from the top of the insulator shell. One of the ceramic capacitors had broken, probably due to the tensile stresses placed on it during thermal cycling.

Example 2A and Comparative Example 2B

The conditions in examples 1A and 1B above were repeated, except that the shells containing the ceramic capacitors were filled (potted) with a commercial electrical grade (filled) polyurethane. Following curing of the potting material, the capacitance on both shells was measured and determined to be on the order of 160 pF between the metal base plate and the top washer.

The shells containing the flexible connector and the rigid rod connector were thermally cycled once from room temperature to –27° C. The capacitance on both shells was again measured and determined to be on the order of 160 pF.

Both shells were then thermally cycled for 12 cycles between room temperature and 125° C. by allowing a four hour dwell time at each temperature. The capacitance of the shell containing the rigid threaded rod connector was not measurable, indicating an open circuit condition. As determined by an X-ray measurement, the capacitors fractured after the thermal cycling. In contrast, the capacitance of the shell containing the flexible connector was measured and determined to be unchanged from the initial reading, indicating no damage from the thermal cycling.

Example 3A and Comparative Example 3B

The conditions in examples 2A and 3A above were repeated, except that the filled polyurethane potting material was replaced with an unfilled polyurethane potting material. Following one thermal cycle from room temperature to 125° C., the shell containing the rigid threaded rod connector exhibited a decrease in capacitance, indicating a capacitor fracture. In contrast, the shell containing the flexible connector between the two capacitors showed no change in capacitance following 24 thermal cycles from room temperature to 125° C., indicating no damage from the thermal cycling.

The preferred embodiments have been set forth herein for the purpose of illustration. However, this description should not be deemed to be a limitation on the scope of the invention. Accordingly, various modifications, adaptations, and alternatives may occur to one skilled in the art without departing from the spirit and scope of the claimed inventive concept.

What is claimed is:

1. A device comprising: a first capacitor; a second capacitor; and a flexible connector electrically connecting the first capacitor and the second capacitor, wherein the connector is axially flexible along an axis between the first capacitor and the second capacitor, and wherein the connector expands in the axial direction along the axis between the first capacitor and the second capacitor when the first capacitor and the second capacitor move away from each other and wherein the connector contracts in the axial direction along the axis between the first capacitor and the second capacitor when the first capacitor and the second capacitor move toward each other.

2. The device of claim 1, wherein the connector comprises a hose clamp.

3. The device of claim 1, wherein the connector comprises a spring.

4. The device of claim 1, wherein the connector comprises one of an "O" shape, a ">" shape, a "C" shape, an "S" shape and a "Z" shape.

5. The device of claim 1, wherein the connector comprises a first portion containing a non-zero radius of curvature.

6. The device of claim 5, wherein the connector comprises a circle, an oval, a portion of a circle or a portion of an oval.

7. The device of claim 1, wherein the connector comprises a first portion inclined at a first, non-zero angle with respect to the axis between the first capacitor and the second capacitor.

8. The device of claim 7, wherein the connector comprises a second portion inclined at a second angle with respect to the first portion.

9. The device of claim 1, wherein the first capacitor and the second capacitor comprise ceramic capacitors and the connector comprises a steel band.

10. The device of claim 1, wherein the connector comprises at least one electrically insulating layer supporting at least one conductive layer electrically connecting the first capacitor and the second capacitor.

11. The device of claim 1, wherein the connector comprises an axially flexible material.

12. The device of claim 1, wherein the connector comprises a first portion slidably mounted with respect to a second portion.

13. The device of claim 1, wherein the connector further comprises a screw or a clamp for adjusting the linear alignment of the first capacitor and the second capacitor.

* * * * *